United States Patent
Zhang et al.

(10) Patent No.: US 12,463,038 B2
(45) Date of Patent: Nov. 4, 2025

(54) CARBON AND BORON IMPLANTATION FOR BACKSIDE CHEMICAL MECHANICAL PLANARIZATION CONTROL

(71) Applicant: Applied Materials, Inc., Santa Clara, CA (US)

(72) Inventors: Yan Zhang, Westford, MA (US); Johannes M. van Meer, Middleton, MA (US); Jae Young Lee, Bedford, MA (US); Naushad Variam, Marblehead, MA (US)

(73) Assignee: Applied Materials, Inc., Santa Clara, CA (US)

( * ) Notice: Subject to any disclaimer, the term of this patent is extended or adjusted under 35 U.S.C. 154(b) by 413 days.

(21) Appl. No.: 18/105,302

(22) Filed: Feb. 3, 2023

(65) Prior Publication Data

US 2024/0266175 A1     Aug. 8, 2024

(51) Int. Cl.
*H01L 21/265*     (2006.01)
*H01L 21/306*     (2006.01)
*H01L 21/768*     (2006.01)

(52) U.S. Cl.
CPC .. *H01L 21/26506* (2013.01); *H01L 21/30625* (2013.01); *H01L 21/76898* (2013.01)

(58) Field of Classification Search
None
See application file for complete search history.

(56) References Cited

U.S. PATENT DOCUMENTS

| | | | |
|---|---|---|---|
| 6,348,706 B1 | 2/2002 | Sandhu | |
| 6,541,397 B1 | 4/2003 | Bencher | |
| 2008/0237661 A1* | 10/2008 | Ranade | H01L 21/26513 438/293 |
| 2016/0204035 A1* | 7/2016 | Huang | H01L 21/3046 438/296 |
| 2020/0365509 A1* | 11/2020 | Sasaki | H01L 23/5226 |
| 2022/0028994 A1* | 1/2022 | Chen | H10D 62/121 |
| 2022/0246747 A1 | 8/2022 | Han et al. | |
| 2023/0065473 A1* | 3/2023 | Chen | H01L 21/76898 |

OTHER PUBLICATIONS

Yang et al., Retardation in the Chemical-Mechanical Polish of the Boron-Doped Polysilicon and Silicon. IEEE Electron Device Letters vol. 21, No. 5, May 2000.

* cited by examiner

*Primary Examiner* — Erik Kielin
(74) *Attorney, Agent, or Firm* — Nields, Lemack & Frame, LLC (57) ABSTRACT

A method of processing a workpiece that will include a backside power delivery network is disclosed. The method includes forming a CMP marker layer in the workpiece at the depth to which the workpiece is to be thinned. This CMP marker layer, which may be a boron-rich layer, serves to slow the chemical-mechanical planarization (CMP) process. To minimize the diffusion of boron in this boron-rich layer, the boron-rich layer is sandwiched by implants of a first species of ions, where this first species of ions serves to slow the diffusion of the boron. In certain embodiments, carbon is used as the first species of ions.

16 Claims, 6 Drawing Sheets

CARBON AND BORON IMPLANTATION FOR BACKSIDE CHEMICAL MECHANICAL PLANARIZATION CONTROL

FIELD

Embodiments of the present disclosure relate to systems and methods for controlling backside planarization processes, particularly in semiconductors that utilize backside power delivery networks.

BACKGROUND

There is interest in continuing to increase the number of semiconductor devices on each die. Many of these improvements have been associated with the shrinking of the actual devices through improved patterning and implant techniques. However, there is a current interest in pursuing a different approach.

Currently, all of the metal layers, which are used to carry signals and power rails, are created on the top surface of the semiconductor device. In certain embodiments, there may be up to 10 or more metal layers used for these purposes. The number of metal layers increases the thickness of the device, and may increase parasitic capacitance, which degrades device performance. By moving the power rails to the backside of the semiconductor, it is believed that these parasitic effects and cell height may be reduced. This technique is referred to a backside power rails (BPR) or backside power delivery network (PDN).

To form the backside power delivery network, the workpiece is thinned after the completion of the Front End Of the Line (FEOL) processing and the Back End Of the Line (BEOL) processing. The FEOL processing includes well formation, the formation of the source and drain regions, and the creation of the gates. The BEOL processing includes adding metal lines and vias to connect the active device to power supply and signals. The thinning of the workpiece is typically achieved using chemical-mechanical planarization (CMP). To achieve the desired device performance, the workpiece is thinned such that a desired thickness of the workpiece exists between the exposed backside and the implanted regions. If this thickness is too great, parasitic capacitance increases and yield degradation may result. In the thickness is too small, the etch stop layer may also be etched during post CMP processes, which also results in yield degradation.

However, determining when to stop the CMP process to achieve the desired thickness is non-trivial. Therefore, it would be beneficial if there was a method to processing the workpiece so that the stop point of the CMP process could be more easily determined.

SUMMARY

A method of processing a workpiece that will include a backside power delivery network is disclosed. The method includes forming a CMP marker layer in the workpiece at the depth to which the workpiece is to be thinned. This CMP marker layer, which may be a boron-rich layer, serves to slow the chemical-mechanical planarization process. To minimize the diffusion of boron in this boron-rich layer, the boron-rich layer is sandwiched by implants of a first species of ions, where this first species of ions serves to slow the diffusion of the boron. In certain embodiments, carbon is used as the first species of ions.

According to one embodiment, a method of fabricating a semiconductor device having active devices connected with a backside power delivery system is disclosed. The method comprises implanting a marking species into a front side of a workpiece to create a CMP marker layer, wherein the CMP marker layer has a peak concentration of the marking species at a first depth; performing front end of line (FEOL) processes on the front side of the workpiece to create the active devices; performing back end of line (BEOL) processes to create metallization layers on the front side of the semiconductor device; thinning the workpiece using a CMP process on a backside of the workpiece, wherein the CMP process slows when the CMP marker layer is exposed; creating nano through silicon vias (nTSVs) to expose the active devices within the semiconductor device; and adding metallization layers to the back side of the workpiece, wherein the metallization layers contact the active devices. In some embodiments, the method further comprises implanting a first species of ions into the front side of the workpiece such that a peak concentration of the first species of ions is at a depth greater than the first depth, wherein the first species of ions suppress diffusion of the marking species. In some embodiments, the method further comprises implanting a first species of ions into the front side of the workpiece such that a peak concentration of the first species of ions is at a depth shallower than the first depth, wherein the first species of ions suppress diffusion of the marking species. In some embodiments, the method further comprises performing a first implant of a first species of ions into the front side of the workpiece such that a peak concentration of the first species of ions is at a depth greater than or equal to the first depth, wherein the first species of ions suppress diffusion of the marking species; and performing a second implant of the first species of ions into the front side of the workpiece such that a peak concentration of the first species of ions implanted in the second implant is at a depth shallower than or equal to the first depth. In some embodiments, the first species of ions comprise carbon ions. In some embodiments, the marking species comprises boron. In some embodiments, the peak concentration of the marking species is greater than 1E18 atoms/cm$^3$. In some embodiments, the peak concentration of the marking species is greater than 1E19 atoms/cm$^3$. In some embodiments, the first depth is between 100 nm and 250 nm.

According to another embodiment, a method of fabricating a semiconductor device capable of having active devices connected with a backside power delivery system is disclosed. The method comprises performing a first implant of a first species of ions into the front side of a workpiece; implanting a marking species into a front side of the workpiece, such that a peak concentration of the marking species is at a first depth; performing a second implant of a first species of ions into the front side of a workpiece; wherein after the first implant, the second implant and the implanting of the marking species, a CMP marker layer is created; performing front end of line (FEOL) processes on the front side of the workpiece to create the active devices; performing back end of line (BEOL) processes to create metallization layers on the front side of the semiconductor device; and thinning the workpiece using a CMP process on a backside of the workpiece, wherein the CMP process slows when the CMP marker layer is exposed. In some embodiments, the first species of ions suppress diffusion of the marking species. In certain embodiments, the first species of ions comprises carbon ions. In some embodiments, the marking species comprises boron ions. In some embodiments, a depth of a peak concentration of the first species of ions implanted during the first implant is equal to or greater than the first depth. In some embodiments, a depth of a peak concentration of the first species of ions implanted during the second implant is less than or equal to the first depth. In some embodiments, the peak concentration of the marking species is greater than 1E18 atoms/cm$^3$. In some embodiments, the peak concentration of the marking species is greater than n 1E19 atoms/cm$^3$. In some embodiments, the first depth is between 100 nm and 250 nm.

BRIEF DESCRIPTION OF THE FIGURES

For a better understanding of the present disclosure, reference is made to the accompanying drawings, which are incorporated herein by reference and in which.

DETAILED DESCRIPTION

As described above, in applications that utilize backside power delivery networks, it is desirable to thin the workpiece to a desired thickness. However, the CMP process may not be able to reliably achieve this desired thickness due to variations in process conditions. Therefore, a method that consistently achieves the desired thickness would be beneficial. One such method is illustrated in the figures.

Figure 1A:
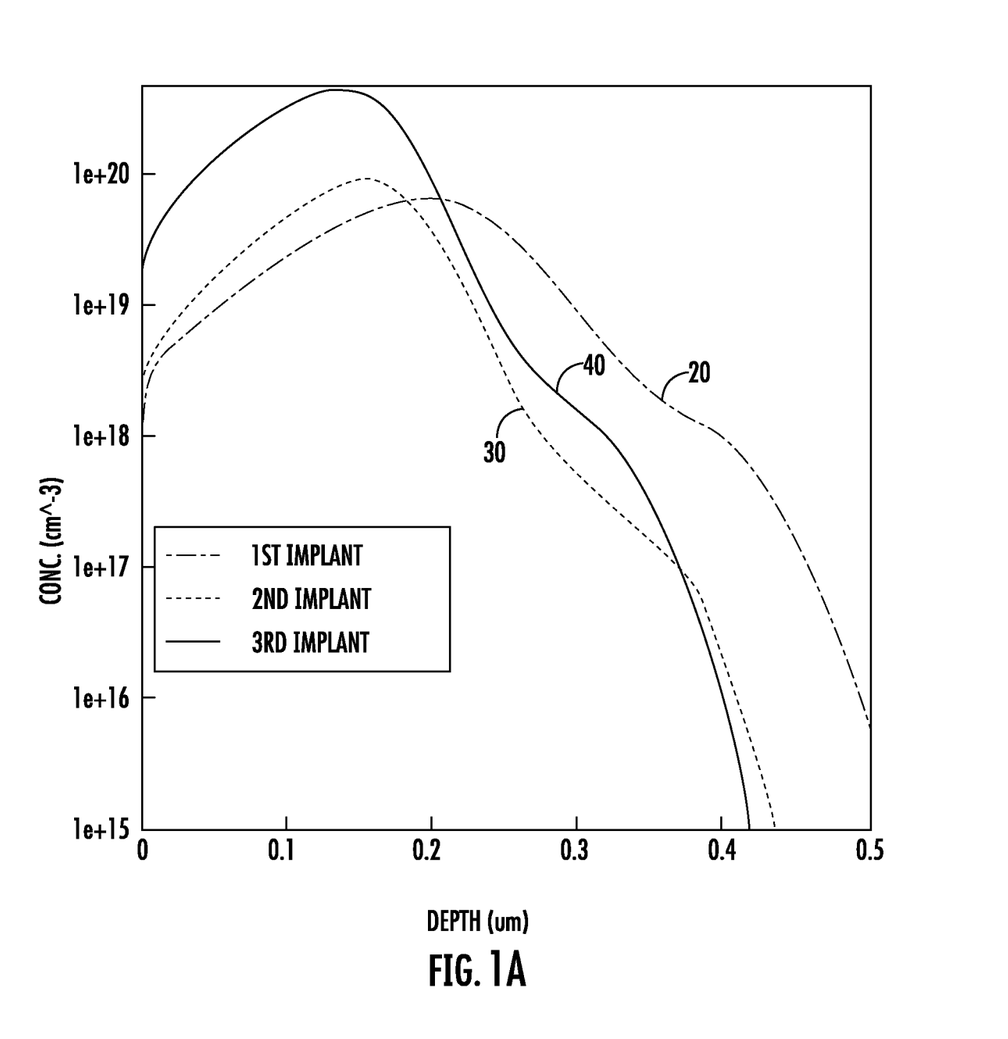
FIG. 1A shows concentration profiles for three implants that may be used to create the CMP marker layer.

FIG. 1A shows a graph of concentration versus depth of three different implants performed on the front side of a workpiece. This workpiece may be a silicon workpiece, or another type of workpiece. A first implant 20 of a first species of ions is implanted into the front side of the workpiece. The first species of ions may be a species that suppresses the diffusion of the marking species, as described in more detail below. This first species of ions may be carbon in some embodiments. This first implant 20 is performed at an energy such that the peak concentration of the first species of ions is located at a depth that is between 150 nm and 300 nm. The first implant 20 may create a Gaussian concentration profile, where the peak concentration is greater than 1E18 atoms/cm$^3$. In some embodiments, the peak concentration is greater than 1E19 atoms/cm$^3$.

A second implant 30 is then performed. The second implant 30 may utilize a marking species. In some embodiments, the marking species may be boron. The second implant 30 may be performed at an energy such that the peak concentration of the marking species is located at a depth of between 100 nm and 250 nm. The peak concentration of the second implant 30 may be greater than 1E18 atoms/cm$^3$. In certain embodiments, it may be greater than 1E19 atoms/cm$^3$. Further, the first implant 20 is performed such that the peak concentration of first species of ions may be at a depth that is greater than or equal to the depth of the peak concentration of the marking species.

A third implant 40 is then performed, using the first species. This third implant 40 is performed at an energy such that the peak concentration is at a depth that is shallower than the depth of the peak concentration of the first species implanted during the first implant 20. In some embodiments, the peak concentration of the first species may be at a depth that is less than or equal to the depth of the peak concentration of the marking species. For example, the peak concentration of the third implant may be at a depth that is between 100 nm and 250 nm. The peak concentration of the third implant 40 may be greater than 1E18 atoms/cm$^3$. In certain embodiments, it may be greater than 1E19 atoms/cm$^3$. In certain embodiments, it may be greater than 1E20 atoms/cm$^3$.

As shown in FIG. 1, the width of each of these implants, as measured as the distance where the concentration is greater than 1E17 atoms/cm$^3$, may be greater than 400 nm.

The implants described above may be performed in a different order if desired. For example, the third implant 40 may be performed before the first implant 20.

Figure 1B:
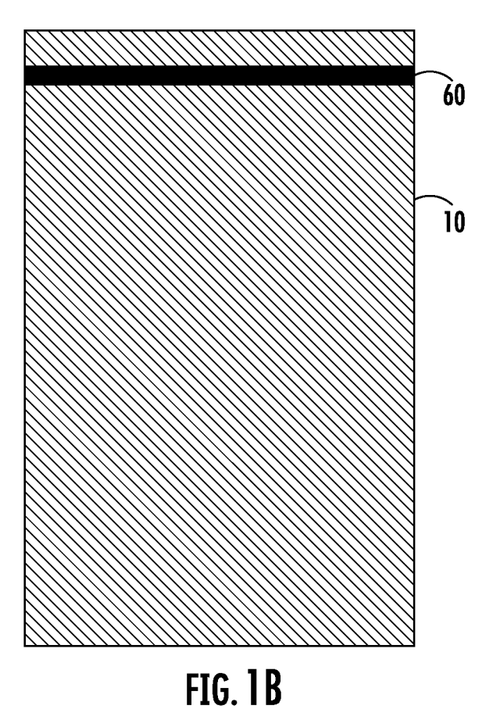
FIG. 1B shows the workpiece after the implants shown in FIG. 1A.

At the conclusion of this sequence, as shown in FIG. 1B, the workpiece 10 has a CMP marker layer 60. In some embodiments, the CMP marker layer 60 may be made up of the marking species and the first species. While FIG. 1A shows the marking species extending all the way to the surface of the workpiece 10, the CMP marker layer 60 is intended to show that region where the concentration of the marking species is greatest, which may be at a depth that is 100 nm to 150 nm. As described above, the marking species is sandwiched on either side by a first species of ions that may suppress the diffusion of the marking species upwards and downwards during the subsequent thermal treatments.

Figure 2:
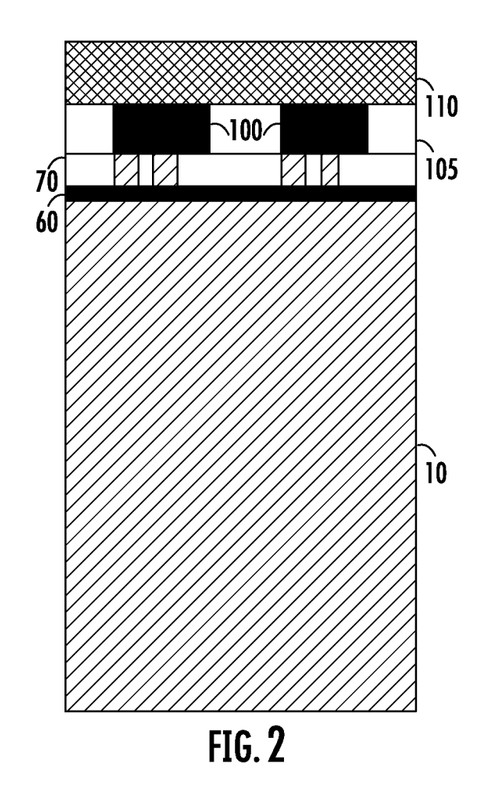
FIGS. 2-3 shows the fabrication processes performed to create a semiconductor device on the front side of the workpiece according to one embodiment.

After the CMP marker layer 60 has been created, the semiconductor devices may be fabricated on the front surface of the workpiece 10, as shown in FIG. 2. First, well-known front end of the line (FOEL) processes are used to form the active devices 100. For example, in some embodiments, certain processes, such as the formation of well isolation, are performed by implanting ions into the workpiece 10. Additionally, shallow trench isolation (STI) 70 may be created at this time. After the ions have been implanted into portions of the workpiece 10, an epitaxial growth process may be performed to create an epitaxially grown layer 105 on the workpiece 10. Additional processes may be performed on the epitaxially grown layer 105 to create active devices 100. These processes include dummy gate formation, spacer formation, source and drain (S/D) formation and replace-metal-gate (RMG) formation.

Additionally, one or more deposited layers 110 may be grown on top of the epitaxially grown layer 105. These one or more deposited layers 110 may include dielectric layers, epitaxial polysilicon and others.

Figure 3:
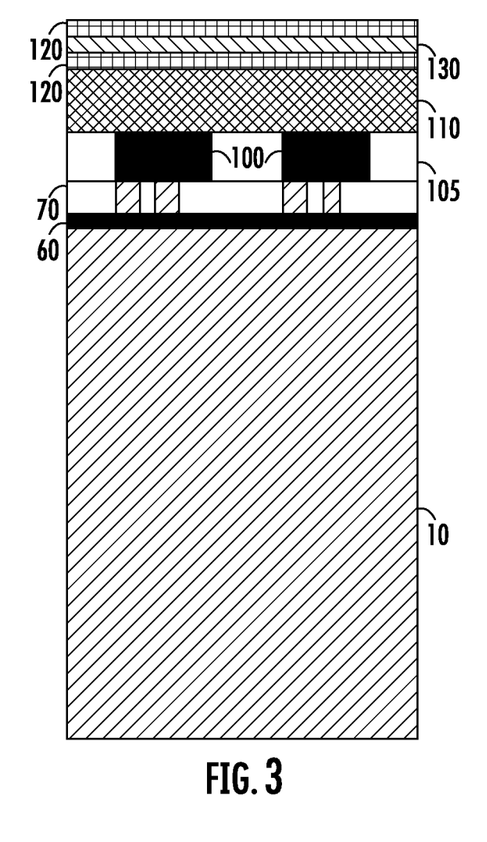

Next, as shown in FIG. 3, the metallization layers 120 are added on top of the one or more deposited layers 110. There may be one or more metallization layers 120, and the number of metallization layers is not limited by this disclosure. Dielectric layers 130 may be disposed between adjacent metallization layers 120 to prevent electrical shorts between metallization layers 120. The metallization layers 120 serve to connect signals. For example, the gate connections may also be created using the metallization layers 120. The creation of the metallization layers 120 is referred to as the back of the line (BEOL) processes.

Figure 4:
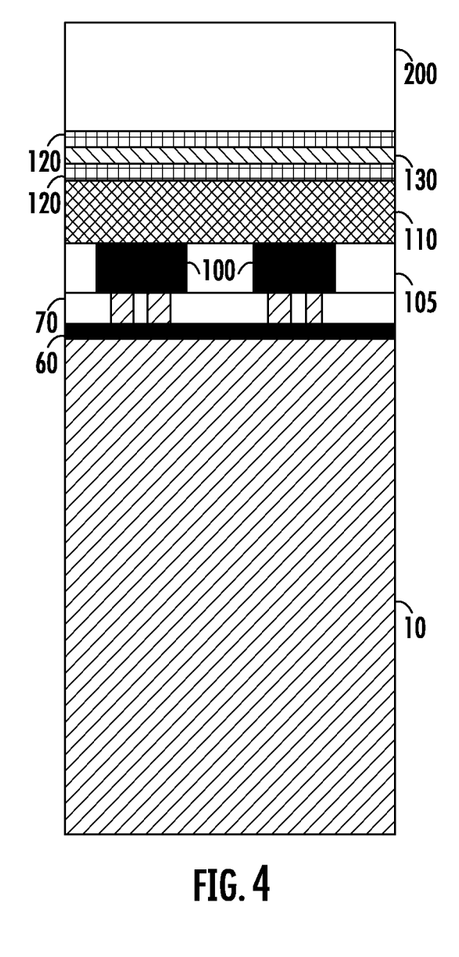
FIGS. 4-8 show the fabrication processes performed to create the backside power delivery network according to one embodiment.
Figure 5:
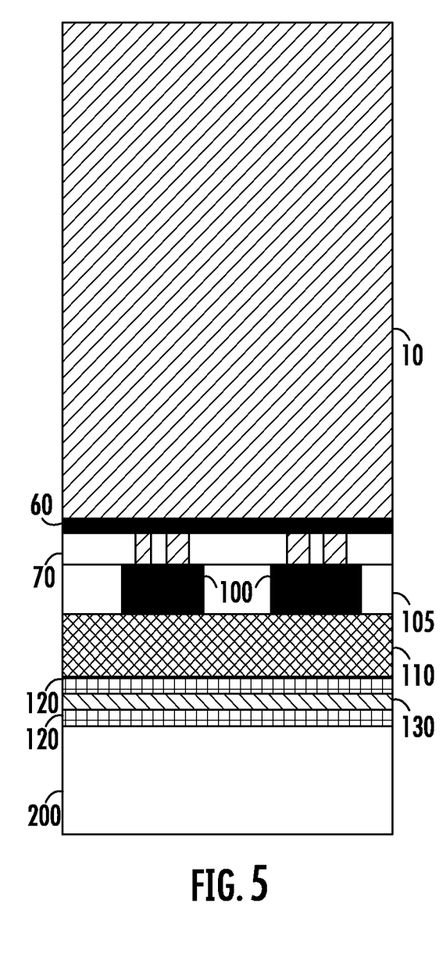

Thus, at the end of FIG. 3, the workpiece 10 has undergone several implant processes to create the CMP marker layer 60, and also undergone the FEOL processes and the BEOL processes. Next, as shown in FIG. 4, a handler wafer 200 is attached to the top surface of the processed workpiece. This may be done using an adhesive or using any suitable technique. The assembly, which includes the processed workpiece and the handler wafer 200 is then inverted, as shown in FIG. 5.

Figure 6:
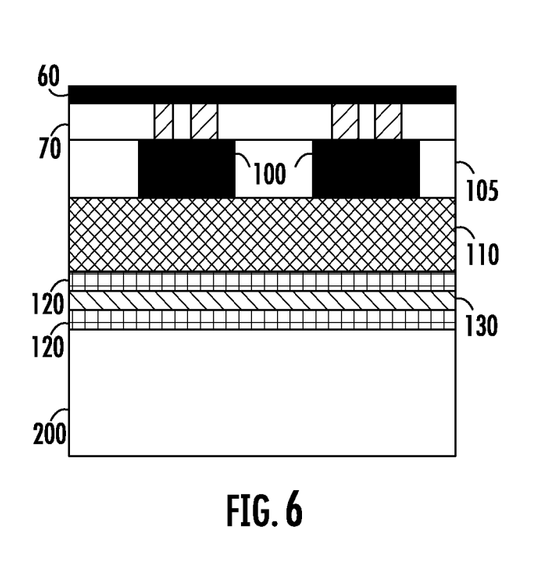

The workpiece 10 is then thinned. After much of the workpiece 10 has been thinned using a grinding process, a chemical-mechanical planarization (CMP) process, as shown in FIG. 6, is used to thin down the workpiece to the final thickness. Notably, the boron in the CMP marker layer 60 serves to significantly slow the CMP process. In this way, the variability of the thickness of the workpiece 10 that remains after the CMP process is greatly reduced.

Figure 7:
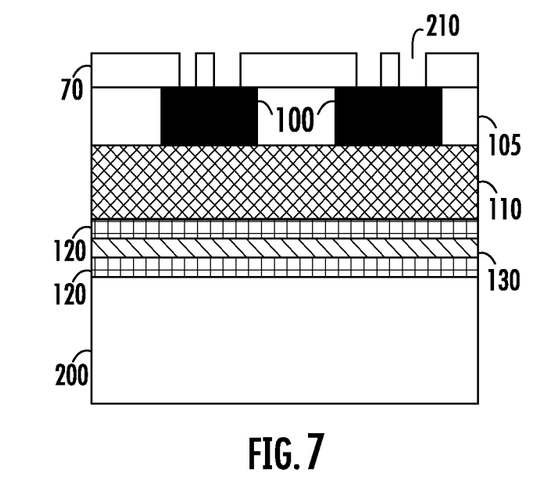

Next, as shown in FIG. 7, nano-through silicon vias (nTSVs) 210 are formed in the workpiece 10, so as to allow the active devices 100 to be exposed on the top surface of the workpiece 10.

Figure 8:
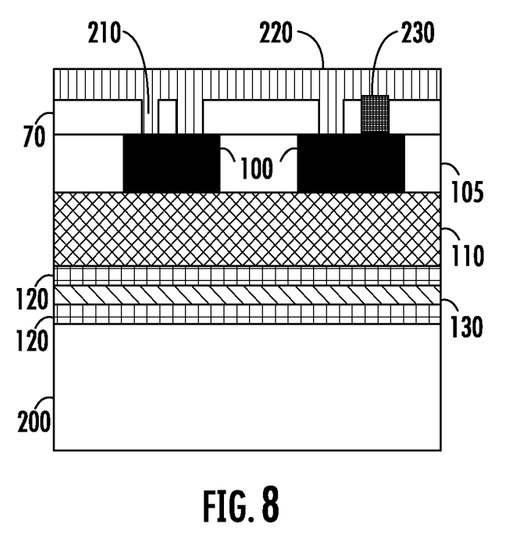

Finally, as shown in FIG. 8, backside metallization layers 220 are applied to the back side of the workpiece 10. The backside metallization layers 220 contact the active devices 100 through the nTSVs 210. The backside metallization layers 220 may be used as the backside power rails or as part of the backside power delivery network. Some of the nTSVs 210 may be filled with a dielectric material 230 to create isolation. The handler wafer 200 may be removed at this time.

While FIG. 1A shows one technique that may be used to create the CMP marker layer 60, other sequences may also be used. For example, in one embodiment, only one of the first implant 20 and the third implant 40 is performed. In other words, rather than being sandwiched by the implants of the first species, the marking species is only abutted on one side by the first species. In some embodiments, in addition to the marking species, only the first implant 20 is performed. In other embodiments, in addition to the marking species, only the third implant 40 is formed. In yet another embodiment, neither the first nor the third implants are performed. In each of these embodiments, the CMP marker layer 60 serve to slow the CMP process. The first implant 20 and third implant 40 may be beneficial in reducing the diffusion of the marking species, especially during other thermal processes.

The embodiments described above in the present application may have many advantages. As described above, the thinning of the workpiece is critical in the creation of devices that have backside power rails or backside power delivery networks. However, the thickness of the workpiece after CMP process may vary based on process variation. This may cause device performance impact and may impact yield. The ability to tightly control the depth to which the CMP process thins the workpiece alleviates this problem and may help improve yield and device performance. Thus, by using a marking species, such as boron, the rate of thinning in the CMP process is slowed. This allows more tightly controlled and repeatable thicknesses to be achieved.

Furthermore, during the FEOL process, the workpiece 10 will undergo thermal treatments such as high temperature well annealing, post well implant, STI annealing, post STI deposition, source/drain annealing and RMG annealing. These FEOL processes cause diffusion of the marking species and reduce its concentration. The CMP etch rate is dependent on the concentration of the marking species and therefore the sandwich implants with first species may suppress the diffusion of the CMP marker layer 60 and allow a CMP marker region with high concentrations of the marking species to effectively reduce CMP etch rate. Meanwhile, the third implant 40 may also retard diffusion of the well implanted species and therefore help form a good isolation region.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of fabricating a semiconductor device having active devices connected with a backside power delivery system, comprising:
    implanting a marking species into a front side of a workpiece to create a Chemical Mechanical Planarization (CMP) marker layer, wherein the CMP marker layer has a peak concentration of the marking species at a first depth;
    implanting a first species of ions into the front side of the workpiece such that a peak concentration of the first species of ions is at a second depth, greater than the first depth, wherein the first species of ions suppress diffusion of the marking species, wherein the first depth and the second depth are referenced to a same surface of the workpiece such that the first species of ions travel deeper into the workpiece than the marking species;
    performing front end of line (FEOL) processes on the front side of the workpiece to create the active devices;
    performing back end of line (BEOL) processes to create metallization layers on the front side of the semiconductor device;
    thinning the workpiece using a CMP process on a backside of the workpiece, wherein the CMP process slows when the CMP marker layer is exposed;
    creating nano through silicon vias (nTSVs) to expose the active devices within the semiconductor device; and
    adding metallization layers to the back side of the workpiece, wherein the metallization layers contact the active devices.

2. The method of claim 1, wherein the second depth is between 150 nm and 300 nm.

3. The method of claim 1, further comprising performing a second implant of the first species of ions into the front side of the workpiece such that a peak concentration of the first species of ions implanted in the second implant is at a third depth, shallower than or equal to the first depth, wherein the third depth is referenced to the same surface of the workpiece as the first depth and the second depth.

4. The method of claim 3, wherein the first species of ions comprise carbon ions.

5. The method of claim 3, wherein the third depth is between 100 nm and 250 nm.

6. The method of claim 1, wherein the marking species comprises boron.

7. The method of claim 1, wherein the peak concentration of the marking species is greater than 1E18 atoms/cm$^3$.

8. The method of claim 1, wherein the peak concentration of the marking species is greater than 1E19 atoms/cm$^3$.

9. The method of claim 1, wherein the first depth is between 100 nm and 250 nm.

10. A method of fabricating a semiconductor device capable of having active devices connected with a backside power delivery system, comprising:
- implanting a marking species into a front side of a workpiece, such that a peak concentration of the marking species is at a first depth;
- performing a first implant of a first species of ions into the front side of the workpiece, such that a peak concentration of the first species is at a second depth, equal to or greater than the first depth;
- performing a second implant of a first species of ions into the front side of the workpiece, such that a peak concentration of the first species is at a third depth, less than or equal to the first depth, wherein the first depth, the second depth and the third depth are referenced to a same surface of the workpiece;
- wherein after the first implant, the second implant and the implanting of the marking species, a Chemical Mechanical Planarization (CMP) marker layer is created wherein the marking species is sandwiched on either side by the first species of ions;
- performing front end of line (FEOL) processes on the front side of the workpiece to create the active devices;
- performing back end of line (BEOL) processes to create metallization layers on the front side of the semiconductor device; and
- thinning the workpiece using a CMP process on a backside of the workpiece, wherein the CMP process slows when the CMP marker layer is exposed.

11. The method of claim 10, wherein the first species of ions suppress diffusion of the marking species.

12. The method of claim 11, wherein the first species of ions comprises carbon ions.

13. The method of claim 10, wherein the marking species comprises boron ions.

14. The method of claim 10, wherein the peak concentration of the marking species is greater than 1E18 atoms/$cm^3$.

15. The method of claim 10, wherein the peak concentration of the marking species is greater than 1E19 atoms/$cm^3$.

16. The method of claim 10, wherein the first depth is between 100 nm and 250 nm.

* * * * *